United States Patent
Zhai et al.

(10) Patent No.: US 7,571,337 B1
(45) Date of Patent: Aug. 4, 2009

(54) INTEGRATED CIRCUITS AND METHODS WITH TRANSMIT-SIDE DATA BUS DESKEW

(75) Inventors: Shubing Zhai, Shanghai (CN); Xiaoqian Zhang, Shanghai (CN)

(73) Assignee: Integrated Device Technology, Inc., Santa Clara, CA (US)

( * ) Notice: Subject to any disclaimer, the term of this patent is extended or adjusted under 35 U.S.C. 154(b) by 475 days.

(21) Appl. No.: 11/136,056

(22) Filed: May 24, 2005

Related U.S. Application Data (60) Provisional application No. 60/577,408, filed on Jun. 4, 2004.

(51) Int. Cl.
*G06F 13/42* (2006.01)
(52) U.S. Cl. ................................. 713/400; 375/376
(58) Field of Classification Search ............... 370/516; 713/400; 375/376
See application file for complete search history.

(56) References Cited

U.S. PATENT DOCUMENTS

| | | | |
|---|---|---|---|
| 5,802,356 A * | 9/1998 | Gaskins et al. ............... 713/500 |
| 6,259,295 B1 * | 7/2001 | Kriz et al. .................... 327/296 |
| 6,598,132 B2 | 7/2003 | Tran et al. | |
| 6,662,304 B2 * | 12/2003 | Keeth et al. ................. 713/400 |
| 6,687,781 B2 | 2/2004 | Wynne et al. | |
| 7,069,458 B1 * | 6/2006 | Sardi et al. .................. 713/401 |
| 7,161,961 B2 * | 1/2007 | Barker et al. ................. 370/476 |
| 7,190,755 B1 * | 3/2007 | Sung et al. ................... 375/376 |
| 2002/0093994 A1 * | 7/2002 | Hendrickson et al. ........ 370/536 |
| 2002/0163922 A1 | 11/2002 | Dooley et al. | |
| 2003/0016686 A1 | 1/2003 | Wynne et al. | |
| 2003/0053470 A1 | 3/2003 | Divivier | |

* cited by examiner

*Primary Examiner*—Chun Cao
*Assistant Examiner*—Albert Wang
(74) *Attorney, Agent, or Firm*—Myers Bigel Sibley & Sajovec, P.A.

(57) ABSTRACT

A data output circuit includes a plurality of clocked data output buffers, each of which drives a data output thereof responsive to a clock signal and an adjustable multiphase clock signal generator that generates a plurality of clock signals of different phases and that is operative to shift the plurality of clock signals relative to a reference clock signal responsive to a first control signal. The data output circuit further includes a clock signal selector that selectively applies the plurality of clock signals to the data output buffers responsive to a second control signal. The adjustable multiphase clock signal generator may include, for example, a control loop, such as a phase locked loop or a delay locked loop, which selectively feeds back one of the plurality of clock signals responsive to the first control signal. The clock signal selector may include a plurality of clock signal selectors, respective ones of which receive the plurality of clock signals and selectively apply the plurality of clock signals to respective ones of the data output buffers responsive to the second control signal.

19 Claims, 5 Drawing Sheets

INTEGRATED CIRCUITS AND METHODS WITH TRANSMIT-SIDE DATA BUS DESKEW

RELATED APPLICATION

The present application claims priority from U.S. Provisional Application Ser. No. 60/577,408, entitled Apparatus and Methods for Data Alignment for a High-Speed Data Bus, filed Jun. 4, 2004, the disclosure of which is incorporated by reference herein in its entirety.

BACKGROUND OF THE INVENTION

The present invention relates to integrated circuit devices and methods of operation thereof, and more particularly, to integrated circuits and methods for driving data busses.

As the speed of data busses used in computing, packet processing and other digital electronics applications increases, problems arising from skew between various signals tend to increase. For example, in synchronous data bus applications, skew between bits of a data bus and/or between bits of the data bus and the bus clock signal can cause errors in transferring data between a source device and a destination device coupled by the bus. The skew may be attributable to differences between data lines within the source device chip, between data lines within the source device packaging (e.g., lead frame), between data lines of the bus itself, between data lines of the destination device packaging, and/or between data lines in the destination device chip.

Such skew can be reduced by careful design of the devices and/or interconnecting wiring. However, this may require multiple IC and/or board design iterations and/or may preclude the use of IC and/or board layouts that may be desirable for other functional reasons. Moreover, the amount of freedom in varying an IC design tends to be limited, as it is generally desirable that a particular IC be usable in a variety of different board layouts. Accordingly there is a need for integrated circuits and operating methods which can provide improved design flexibility and efficiency while reducing signal skew effects.

SUMMARY OF THE INVENTION

In some embodiments of the present invention, data output circuits are provided for integrated circuits, such as memory and flow control devices. Such a data output circuit includes a plurality of clocked data output buffers, each of which drives a data output thereof responsive to a clock signal and an adjustable multiphase clock signal generator that generates a plurality of clock signals of different phases and that is operative to shift the plurality of clock signals relative to a reference clock signal responsive to a first control signal. The data output circuit further includes a clock signal selector that selectively applies the plurality of clock signals to the data output buffers responsive to a second control signal.

The adjustable multiphase clock signal generator may include, for example, a control loop, such as a phase locked loop or a delay locked loop, which selectively feeds back one of the plurality of clock signals responsive to the first control signal. The clock signal selector may include a plurality of clock signal selectors, respective ones of which receive the plurality of clock signals and selectively apply the plurality of clock signals to respective ones of the data output buffers responsive to the second control signal. The data output circuit may further include a control circuit that generates the first and second control signals responsive to an external input.

According to further aspects of the present invention, an integrated circuit device includes a plurality of data output terminals configured to be connected to respective data lines of an external data bus and a clock signal terminal configured to be connected to an external clock signal line. The device also includes a plurality of clocked data output buffers, respective ones of which drive respective ones of the data output terminals. The device further includes an adjustable multiphase clock signal generator that generates a plurality of clock signals of different phases from a bus clock signal at the clock signal terminal and that is operative to shift the plurality of clock signals relative to the bus clock signal responsive to a first control signal, and a clock signal selector that selectively applies the plurality of clock signals to the data output buffers responsive to a second control signal.

In additional embodiments of the present invention, a packet exchange integrated circuit device includes a first data port configured to receive data packets from a first bus conforming to a first packet interface standard (e.g., System Packet Interface (SPI)-3.x) having a first data bus clock speed. The device also includes a packet converter configured to convert the received data packets to a second packet interface standard (e.g., SPI-4.x) having a second data bus clock speed substantially higher than the first data bus clock speed. The device further includes second data port including a plurality of clocked data output buffers that receive the converted data packets and transmit the converted data packets on a second bus in conformance with the second packet interface standard. An adjustable multiphase clock signal generator generates a plurality of clock signals of different phases from a bus clock signal at the clock signal terminal and is operative to shift the plurality of clock signals relative to a bus clock signal of the second bus responsive to a first control signal. A clock signal selector selectively applies the plurality of clock signals to the data output buffers responsive to a second control signal.

In some method embodiments of the present invention, skew of data signals on a data bus having an associated bus clock signal may be controlled. A plurality of clock signals of different phases is generated, and shifted relative to the bus clock signal responsive to a control signal. Data lines of the data bus are driven responsive to selected ones of the plurality of clock signals. Shifting the plurality of clock signals relative to the bus clock signal responsive to a control signal may include selectively applying the plurality of clock signals to a feedback input of a control loop responsive to the control signal. Driving data lines of the data bus responsive to selected ones of the plurality of clock signals may include selectively applying the plurality of clock signals to a plurality of data output buffers connected to the data lines.

DETAILED DESCRIPTION OF EXEMPLARY EMBODIMENTS

The present invention will now be described more fully herein with reference to the accompanying drawings, in which exemplary embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals or other reference designators refer to like elements throughout. Signals may also be synchronized and/or undergo minor Boolean operations (e.g., inversion) without being considered different signals.

Figure 1:
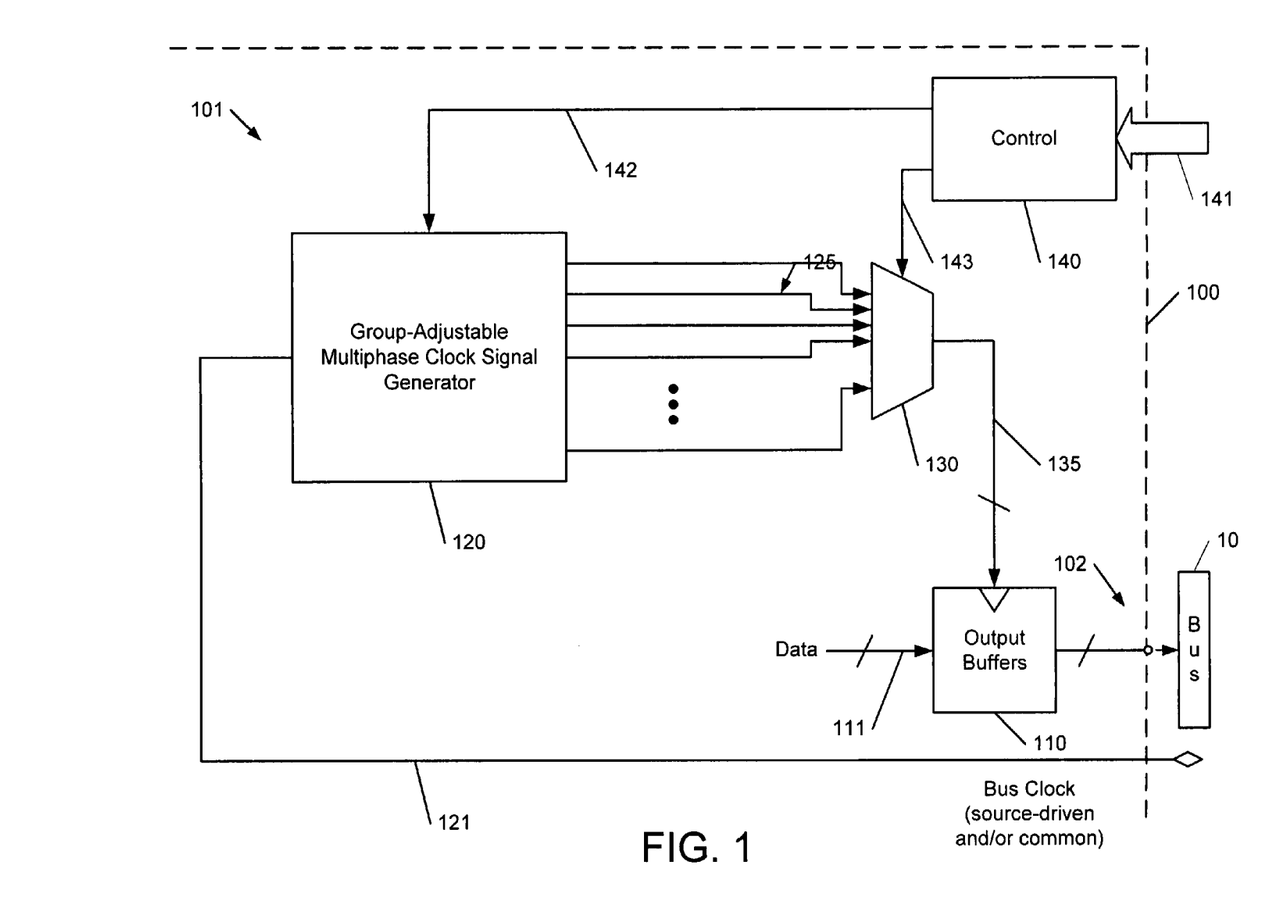
FIG. 1 is a schematic diagram illustrating a data output circuit for an integrated circuit device according to some embodiments of the present invention.

FIG. 1 illustrates and integrated circuit device 100 according to some embodiments of the present invention. The device 100 includes a data output circuit 101 including clocked data output buffers 110 that are configured to received data at data outputs 111 thereof and that responsively drive output terminals 102 subject to one or more clock signals 135. For example, the device 100 may be a memory device or a data transfer device, and the data received by the data output buffers 110 may comprise data from a memory or other circuitry (not shown). The data output circuit 101 further includes an adjustable multiphase clock signal generator 120 that generates a plurality of clock signals 125 of different phases. The adjustable multiphase clock generator 120 is operative, responsive to a control signal 142, to time shift the group of clock signals 125 with respect to a reference clock signal, in this case, a bus clock signal 121 associated with a data bus 10 driven by the data output buffers 110. The bus clock signal 121 may be an externally generated clock signal (e.g., a common clock signal) and/or a source-driven clock produced by a clock signal generator (not shown) within the integrated circuit 100.

The data output circuit 101 further includes a clock signal selector 130 that is configured to receive the group of clock signals 125 and operative, responsive to a control signal 143, to select the one or more clock signals 135 applied to the data output buffers 110 from the plurality of clock signals 125. As shown, a control circuit 140 within the integrated circuit 100 may generate the control signals 142, 143. For example, the control circuit 140 may comprise a control register or fuse array that is programmable by an external input 141 and/or a control processor that adaptively generates the control signals 142, 143 responsive to system parameters.

The control circuit 140 may, for example, support static and/or dynamic deskew operations. For example, in a design process for a system using the device 100, data skew may be measured and/or simulated and used to prepare a configuration file or other input that is used to program the control circuit 140 prior to use of the device 100. In an exemplary dynamic configuration, a destination device that receives data from the data output buffers 110 may be operative to measure data skew and report the skew measurements to the control circuit 140 itself or to an external control processor (not shown) that is operative to program the control circuit 140 to provide a compensating skew adjustment for the data output buffers 110.

It will be appreciated that the data output circuit 101 may be implemented using any of a variety of different circuits. For example, the clocked data output buffers 110 may take a variety of different forms, such as D-flip-flops, J-K flip-flops, clocked latches and the like. The adjustable multiphase clock signal generator 120 may take a variety of different forms including, but not limited to, phase locked loops (PLLs) and delay locked loops (DLLs). The clock signal selector 130 may comprise any of a variety of different signal routing or switching circuits, e.g., multiplexers and/or analog switches.

Figure 2:
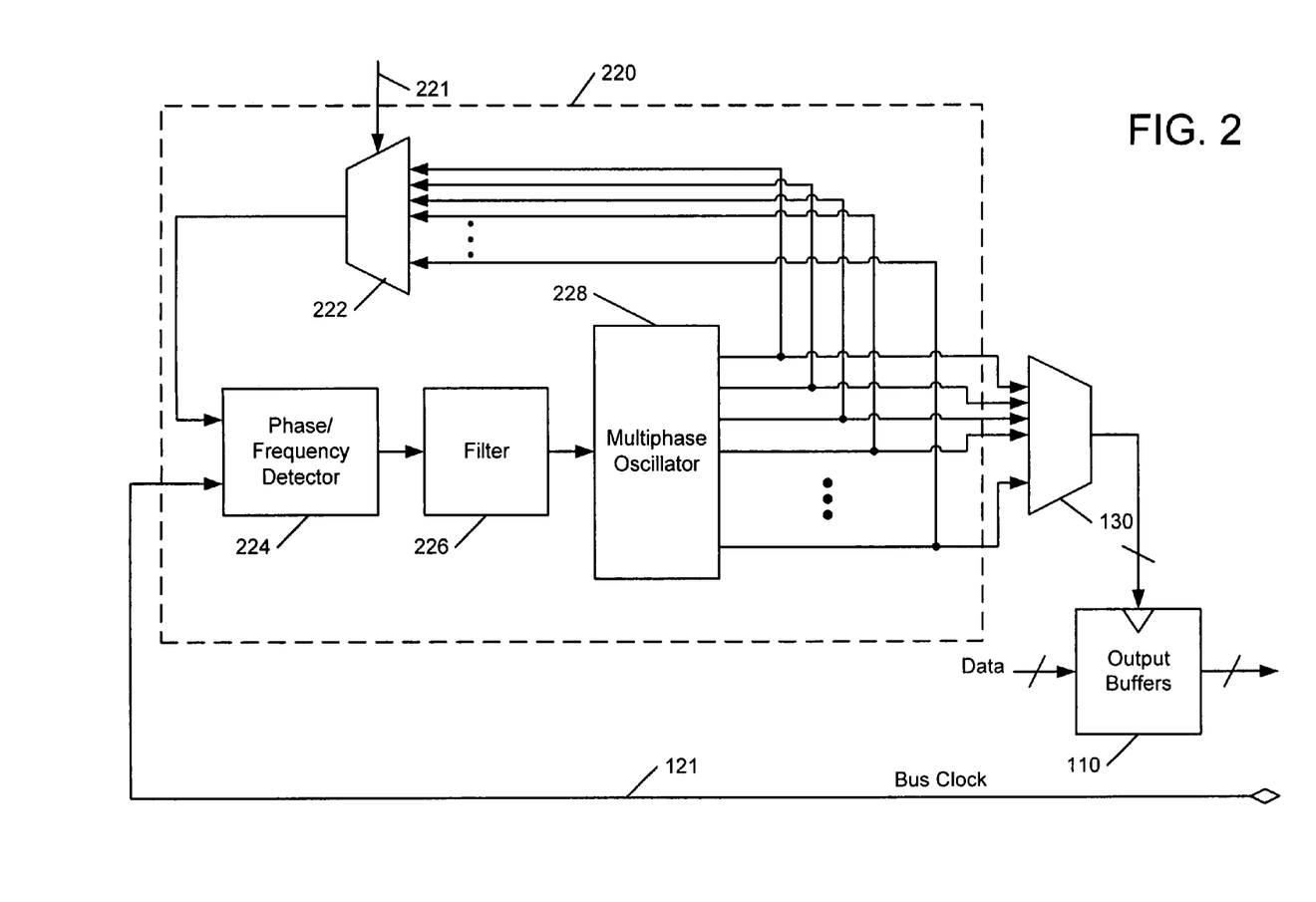
FIG. 2 is a schematic diagram illustrating a data output circuit utilizing a phase locked loop according to further embodiments of the present invention.

FIG. 2 illustrates a phase locked loop implementation of an adjustable multiphase clock signal generator 220 according to some embodiments of the present invention. Like elements of FIGS. 1 and 2 are indicated by like reference numerals and will not be described in further detail in light of the foregoing description of FIG. 1. The clock signal generator 220 includes a phase locked loop comprising a phase/frequency detector 224, a loop filter 226, a multiphase oscillator 228 and a clock signal selector 222. The multiphase oscillator 228, which may include, for example, a combination of a voltage-controlled oscillator (e.g., a ring oscillator), generates a plurality of clock signals of different phases responsive to a control signal applied by the loop filter 226. The loop filter 226 generates the control signal responsive to an error signal generated by the phase/frequency detector 224. The phase/frequency detector 224 produces the error signal responsive to a comparison of a bus clock signal 121 with one of the clock signals produced by the multiphase oscillator 228 and selected by the clock signal selector 222 responsive to a control signal 221. In particular, the clock signal selector 222 allows the clock signals produced by the multiphase oscillator 228 to be shifted in time as a group relative to the bus clock signal 121.

Figure 3:
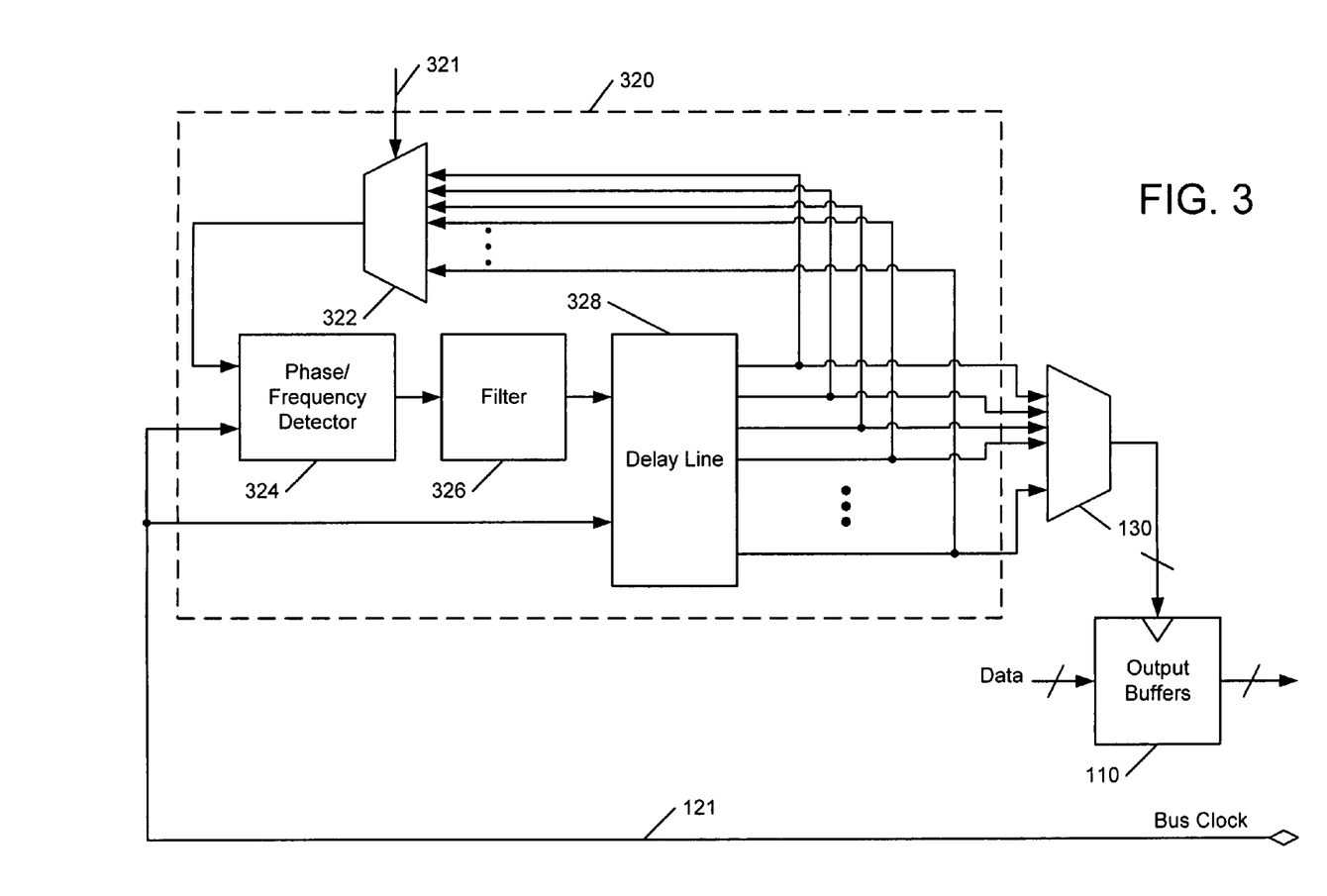
FIG. 3 is a schematic diagram illustrating a data output circuit utilizing a delay locked loop according to still further embodiments of the present invention.

FIG. 3 illustrates a delay locked loop implementation of an adjustable multiphase clock signal generator 320 according to further embodiments of the present invention. Like elements of FIGS. 1 and 3 are indicated by like reference numerals and will not be described in further detail in light of the foregoing description of FIG. 1. The clock signal generator 320 includes a delay locked loop comprising a phase/frequency detector 324, a loop filter 326, a delay line 328 and a clock signal selector 322. The delay line 328 generates a plurality of clock signals of different phases from a bus clock signal 121 responsive to a control signal applied by the loop filter 326. The control signal is developed responsive to an error signal generated by the phase/frequency detector 324. The phase/frequency detector 324 produces the error signal responsive to a comparison of a bus clock signal 121 with one of the clock signals produced by the delay line 328 and selected by the clock signal selector 322 responsive to a control signal 321. In particular, the clock signal selector 322 allows the clock signals produced by the multiphase oscillator 328 to be shifted in time as a group relative to the bus clock signal 121.

Figure 4:
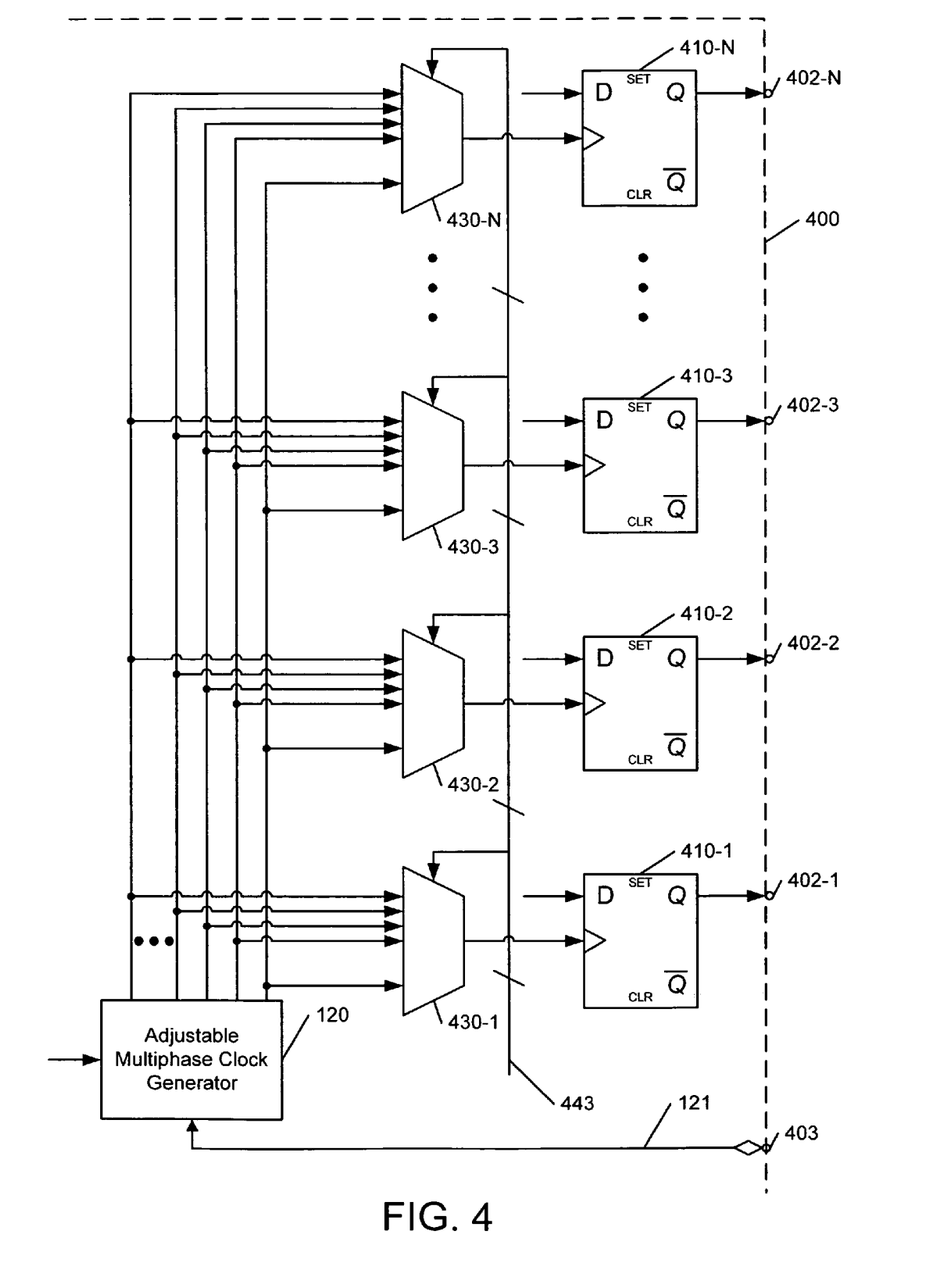
FIG. 4 is a schematic diagram illustrating a data output circuit having data output buffers with associate clock signal selectors according to additional embodiments of the present invention.}

FIG. 4 illustrates further exemplary embodiments of the present invention that can provide selective application of a plurality of clock signals of different phases to individual data output buffers 410-1, 410-2, 410-3, . . . , 410-N that drive output terminals 402-1, 402-2, 402-3, . . . , 402-N, such that skew of individual data bus bits with respect to one another may be controlled. The adjustable multiphase clock signal generator 120 (e.g., as described above with reference to FIGS. 1-3) produces a plurality of clock signals 125 of different phases. Responsive to a control signal 142, the adjustable multiphase clock signal generator 120 may shift the clock signals 125 as a group with respect to a bus clock signal 121 at a clock signal terminal 403. Respective clock signal selectors 430-1, 430-2, 430-3, . . . , 430-N are configured to apply selected ones of the clock signal 125 to respective ones of the data output buffers 410-1, 410-2, 410-3, . . . , 410-N responsive to a plurality of control signals 443. In this manner, the skew of the data output buffers 410-1, 410-2, 410-3, . . . , 410-N may be individually controlled in addition to the grouped phase control provided by the adjustable multiphase clock signal generator 120.

Figure 5:
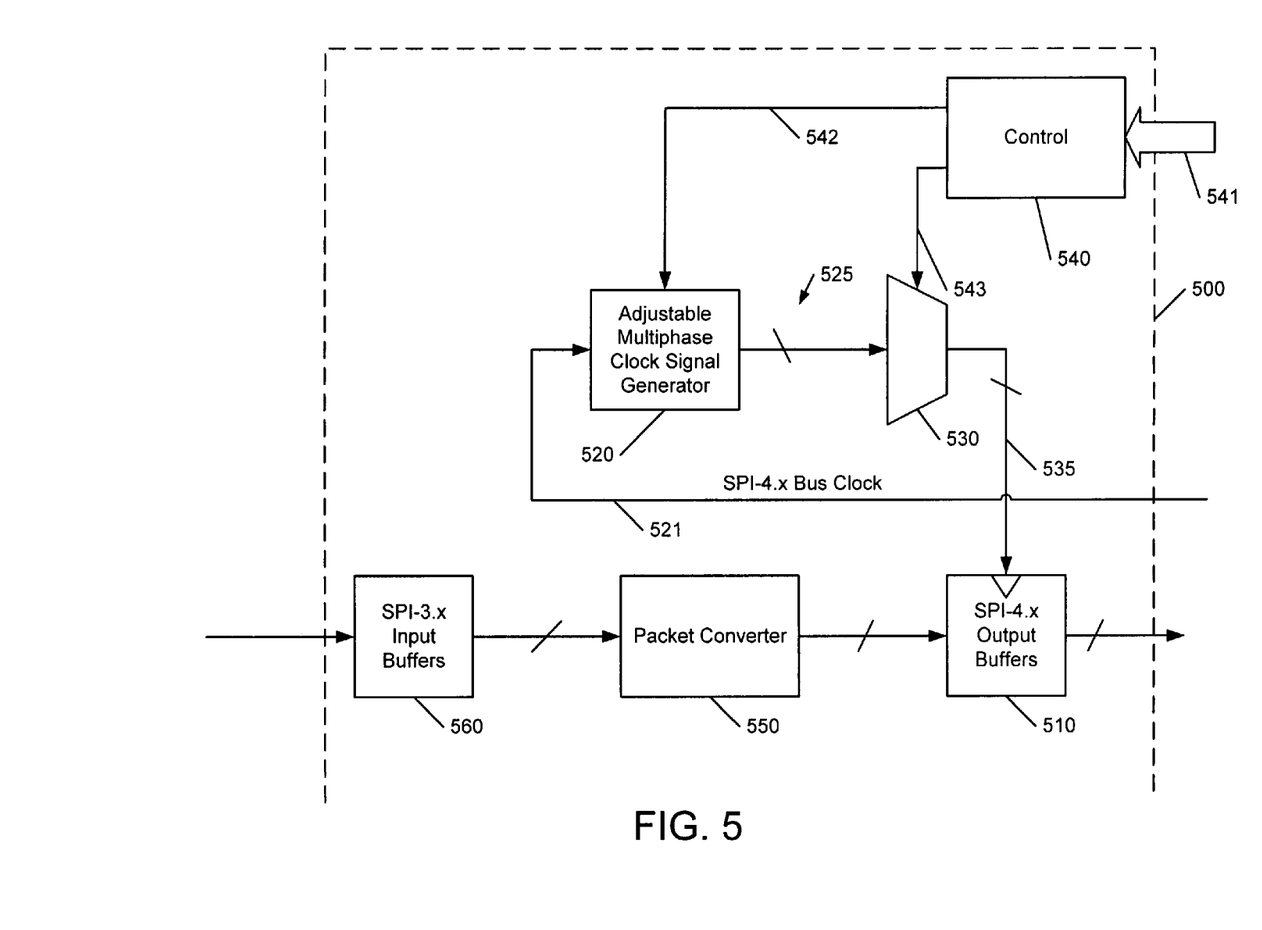
FIG. 5 is a schematic diagram illustrating a packet exchange device including a data output circuit according to further embodiments of the present invention.

FIG. 5 illustrates an exemplary application of an output control circuit according to further embodiments of the present invention. In particular, FIG. 5 illustrates portions of a packet exchange circuit 500 that provides packet transport between a System Packet Interchange (SPI)-3 bus and a relatively high speed (e.g., greater than 300 MHz) double data rate (DDR) SPI-4.x bus, the latter of which may be particularly vulnerable to data skew. As shown, the circuit 500 includes SPI-3.x input data buffers 560 that receive data from an external source and provide the received data to a packet converter 550. The packet converter 550 manages and formats the data for external transmission via SPI-4.x data output buffers 510. The data output buffers 510 are clocked by one or more clock signals 535 selected by a clock signal selector 530 from among a plurality of clock signals 525 generated by an adjustable multiphase clock signal generator 520. Along lines described above with reference to FIGS. 1-3, the plurality of clock signals 525 may be shifted with respect to an SPI-4.x bus clock signal 521 responsive to a first control signal 542, and may be selectively applied to the data output buffers 510 responsive to a second control signal 543. The control signals 542, 543 may be generated by a control circuit 540 responsive to, for example, an external programming and/or control input 541.

In the drawings and specification, there have been disclosed exemplary embodiments of the invention and, although specific terms are employed, they are used in a generic and descriptive sense only and not for purposes of limitation, the scope of the invention being set forth in the following claims.

What is claimed is:

1. An integrated circuit device comprising:
   a plurality of data output terminals configured to be connected to respective data lines of an external data bus;
   a clock signal terminal configured to be connected to an external clock signal line;
   a plurality of clocked data output buffers, respective ones of which drive respective ones of the data output terminals;
   an adjustable multiphase clock signal generator comprising a control loop that generates a plurality of clock signals of different phases from a bus clock signal at the clock signal terminal and that is operative to shift the plurality of clock signals relative to the bus clock signal by selecting a new feedback signal for the control loop from the plurality of clock signals responsive to a first control signal; and
   a clock signal selector configured to selectively apply the plurality of clock signals to the data output buffers on an individual basis responsive to a second control signal to thereby support relative transmit skew adjustment among the data output buffers.

2. A device according to claim 1, wherein the control loop comprises a delay locked loop or a phase locked loop.

3. A device according to claim 1:
   wherein the clock signal selector comprises a first clock signal selector; and
   wherein the adjustable multiphase clock signal generator comprises:
      a multiphase oscillator that generates the plurality of clock signals responsive to a third control signal;
      a loop control circuit that generates the third control signal responsive to a reference clock signal and a clock signal at a clock feedback input thereof; and
      a second clock signal selector that selectively applies the plurality of clock signals to the clock feedback input responsive to the second control signal.

4. A device according to claim 1:
   wherein the clock signal selector comprises a first clock signal selector; and
   wherein the adjustable multiphase clock signal generator comprises:
      a delay line that receives a reference clock signal and generates the plurality of clock signals therefrom with a delay that varies responsive to a third control signal;
      a loop control circuit that generates the third control signal responsive to a reference clock signal and a clock signal at a clock feedback input thereof; and
      a second clock signal selector that selectively applies the plurality of clock signals to the clock feedback input responsive to the second control signal.

5. A device according to claim 1, wherein the clock signal selector comprises a plurality of clock signal selectors, respective ones of which receive the plurality of clock signals and selectively apply the plurality of clock signals to respective ones of the data output buffers responsive to the second control signal.

6. A device according to claim 5, wherein the second control signal comprises a plurality of second control signals, respective ones of which control respective ones of the plurality of clock signal selectors.

7. A device according to claim 1, further comprising a control circuit that generates the first and second control signals responsive to an external input.

8. A packet exchange integrated circuit device comprising:
   a first data port configured to receive data packets from a first external bus conforming to a first packet interface standard having a first data bus clock speed;
   a packet converter configured to convert the received data packets to a second packet interface standard having a second data bus clock speed substantially higher than the first data bus clock speed;
   a second data port including a plurality of clocked data output buffers that receive the converted data packets and transmit the converted data packets on a second external bus in conformance with the second packet interface standard;
   an adjustable multiphase clock signal generator comprising a control loop that generates a plurality of clock signals of different phases from a bus clock signal at the clock signal terminal and that is operative to shift the plurality of clock signals relative to a bus clock signal of the second bus by selecting a new feedback signal for the control loop from the plurality of clock signals responsive to a first control signal; and
   a clock signal selector configured to selectively apply the plurality of clock signals to the data output buffers on an individual basis responsive to a second control signal to thereby support relative transmit skew adjustment among the data output buffers.

9. A device according to claim 8, wherein the clock signal selector comprises a plurality of clock signal selectors, respective ones of which receive the plurality of clock signals and selectively apply the plurality of clock signals to respective ones of the data output buffers responsive to the second control signal.

10. A device according to claim 8, further comprising a control circuit that generates the first and second control signals responsive to an external input.

11. A device according to claim 8, wherein the first packet interface standard comprises an SPI-3.x standard, and wherein the second packet interface comprises an SPI-4.x standard.

12. A device according to claim 11, wherein the external input comprises a measure of skew or a skew adjustment command.

13. A device according to claim 7, wherein the external input comprises a measure of skew or a skew adjustment command.

14. An integrated circuit device comprising:
   a plurality of data output terminals configured to be connected to respective data lines of an external data bus;
   a clock signal terminal configured to be connected to an external clock signal line;
   a plurality of clocked data output buffers, respective ones of which are configured to drive respective ones of the data output terminals;
   an adjustable multiphase clock signal generator configured to generate a plurality of clock signals of different phases from a bus clock signal at the clock signal terminal and to shift the plurality of clock signals relative to the bus clock signal responsive to a first control signal;
   a clock signal selector configured to selectively apply the plurality of clock signals to the data output buffers on an individual basis responsive to a second control signal to thereby support relative skew adjustment of the data output buffers; and
   a control circuit configured to generate the first and second control signals responsive to an external input.

15. An integrated circuit device according to claim 14, wherein the external input comprises an input from a device coupled to the external data bus.

16. An integrated circuit device according to claim 14, wherein the external input comprises a measure of skew or a skew adjustment command.

17. A method of controlling skew of data signals transmitted by data output buffers of an integrated circuit chip coupled to an external data bus having an associated bus clock signal, the method comprising:
   generating a plurality of clock signals of different phases from the bus clock signal;
   shifting the plurality of clock signals relative to the bus clock signal responsive to a first control signal;
   selectively applying the plurality of clock signals to data output buffers on an individual basis responsive to a second control signal to thereby support relative skew adjustment among the data output buffers; and
   generating the first and second control signals responsive to an external input to the integrated circuit chip.

18. A method according to claim 17, further comprising generating a measure of skew on the external data bus and generating the external input responsive to the generated measure.

19. A method according to claim 18, wherein the external input comprises a measure of skew or a skew adjustment command.

* * * * *

UNITED STATES PATENT AND TRADEMARK OFFICE
CERTIFICATE OF CORRECTION

PATENT NO.        : 7,571,337 B1                                        Page 1 of 1
APPLICATION NO.   : 11/136056
DATED             : August 4, 2009
INVENTOR(S)       : Zhai et al.

It is certified that error appears in the above-identified patent and that said Letters Patent is hereby corrected as shown below:

Column 7, Claim 12, Line 8:   Please correct "claim 11" to read -- claim 7 --

Column 7, Claim 13, Line 11:  Please correct "claim 7" to read -- claim 10 --

Signed and Sealed this

Sixth Day of October, 2009

David J. Kappos
*Director of the United States Patent and Trademark Office*